(12) United States Patent
Araki et al.

(10) Patent No.: US 9,655,251 B2
(45) Date of Patent: May 16, 2017

(54) BACKDRILLING METHOD, AND BACKDRILLING APPARATUS

(71) Applicant: Via Mechanics, Ltd., Ebina-shi, Kanagawa Pref. (JP)

(72) Inventors: Yujiro Araki, Zama (JP); Toru Yuki, Ebina (JP); Katsunori Tokinaga, Atsugi (JP)

(73) Assignee: Via Mechanics, Ltd., Ebina-shi (JP)

(*) Notice: Subject to any disclaimer, the term of this patent is extended or adjusted under 35 U.S.C. 154(b) by 192 days.

(21) Appl. No.: 14/627,382

(22) Filed: Feb. 20, 2015

(65) Prior Publication Data

US 2015/0245494 A1  Aug. 27, 2015

(30) Foreign Application Priority Data

Feb. 21, 2014 (JP) .................................. 2014-032000
Dec. 25, 2014 (JP) .................................. 2014-261418
Feb. 3, 2015 (JP) .................................. 2015-019220

(51) Int. Cl.
*H05K 3/00* (2006.01)
*H05K 3/42* (2006.01)
*H05K 1/02* (2006.01)

(52) U.S. Cl.
CPC ......... *H05K 3/0047* (2013.01); *H05K 1/0251* (2013.01); *H05K 3/429* (2013.01); *H05K 2203/0207* (2013.01); *Y10T 408/03* (2015.01); *Y10T 408/173* (2015.01)

(58) Field of Classification Search
CPC .... H05K 3/0047; H05K 1/0251; H05K 3/429; H05K 2203/0207; Y10T 408/03; Y10T 408/173
USPC .......................................................... 33/638
See application file for complete search history.

(56) References Cited

U.S. PATENT DOCUMENTS

| 7,096,555 | B2* | 8/2006 | Tourne | H05K 3/0047 174/260 |
| 2005/0128672 | A1* | 6/2005 | Tourne | H05K 3/0047 361/119 |
| 2015/0047892 | A1* | 2/2015 | Yang | H05K 3/0047 174/262 |
| 2015/0245494 | A1* | 8/2015 | Araki | H05K 3/0047 408/1 R |

FOREIGN PATENT DOCUMENTS

| JP | 3-3009 A | 1/1991 |
| JP | 2009-4585 A | 1/2009 |

* cited by examiner

*Primary Examiner* — Yaritza Guadalupe-McCall
(74) *Attorney, Agent, or Firm* — Crowell & Moring LLP

(57) ABSTRACT

The present invention aims to provide a backdrilling method and a backdrilling apparatus that can ensure the backdrilling depth accuracy. Using a multilayer printed wiring board in which a reference depth detection region is allocated where a reference depth detection layer is formed in the same layer with an internal wiring layer electrically connected to a stub, the thickness and the depth of the reference depth detection layer are measured in the reference depth detection region using a drill bit. The drill bit is moved relative to the multilayer printed wiring board to a backdrilling portion. The drilling is performed using the drill bit to the depth which is calculated using the ratio of the depth of the reference depth detection layer to the thickness of the multilayer printed wiring board in the reference depth detection region.

8 Claims, 4 Drawing Sheets

BACKDRILLING METHOD, AND BACKDRILLING APPARATUS

BACKGROUND OF THE INVENTION

Field of the Invention

The present invention relates to a backdrilling method and a backdrilling apparatus for a multilayer printed wiring board.

Description of the Related Art

In order to mount electronic components, such as large-scale integrated circuits (LSIs), on multilayer printed wiring boards, through-holes are formed as terminals to connect to predetermined internal wiring layers, and the through-holes are plated with conductive materials. However, because the plated portions in the through-holes are longer than desired, problems may be caused in some cases, such as impedance mismatch, signal delay or rounded waveform, unless the excessively long portions (hereinafter referred to as "stubs") are shortened.

Thus, backdrilling is required to remove such excessively plated portion, which is a stub, using a drill bit with a slightly larger size than the through-hole size from the backside. In backdrilling, it is important how the stub is removed. In this regard, one problem is how to control the depth of backdrilling.

Conventionally, in order to accurately control the drilling depth, an internal conductor layer for detecting a reference depth (hereinafter referred to as a "reference depth detection layer") is formed in advance near a backdrilling portion in a multilayer printed wiring board, as disclosed in JP-A-2009-4585. In this technique, drilling is performed toward the reference depth detection layer prior to backdrilling so as to measure the reference depth, and then the depth control of backdrilling is performed based on the reference depth.

In this conventional technique, it is necessary to allocate a region for the reference depth detection layer (hereinafter referred to as a "reference depth detection region") as close to the backdrilling portion as possible in the multilayer printed wiring board. However, because the reference depth detection region is useless for the formation of the intended circuit in other words, it is desirable to allocate, if possible, the reference depth detection region in the outer marginal region of the board away from the backdrilling portion.

However, a multilayer printed wiring board is typically formed by heating and compressing a alternate stacking of resin layers and conductive wiring layers. Thus, as illustrated in FIG. 4, the central portion of a board may become thicker than the outer marginal region, and the depth of the internal wiring layer may vary as the board thickness varies. FIG. 4 is a cross-sectional view illustrating the state of such variation in an exaggerated manner.

Thus, when the reference depth detection region is allocated apart from the circuit formation region in the central portion of the board, for example, the reference depth of the internal wiring layer obtained in the reference depth detection region may become useless to determine the depth in the central portion. As a result, it may become impossible to ensure the depth accuracy for backdrilling in the circuit formation region in the central portion of the board.

JP-A-H3-3009 describes a technique for ensuring the depth accuracy by measuring the board thickness at a machining position and then calculating the drilling depth by multiplying the board thickness by a predetermined ratio, even when the thicknesses of the layers of the multilayer printed wiring board or its board thickness vary.

However, JP-A-H3-3009 does not describe how and when the predetermined ratio is obtained. Specifically, it does not clarify the relationship between the method for calculating the ratio and the method for using the ratio, particularly in regards to backdrilling.

SUMMARY OF THE INVENTION

An object of the present invention is to provide a backdrilling method and a backdrilling apparatus that can ensure the backdrilling depth accuracy even when the reference depth detection region is allocated apart from the circuit formation region in a multilayer printed wiring board having variations in thickness of its layers or its board thickness.

In order to solve the above-described problems, a backdrilling method of claim 1 for removing a stub present in a through-hole formed in a multilayer printed wiring board mounted on a table by drilling using a drill bit includes: using a multilayer printed wiring board in which a reference depth detection region is allocated where a reference depth detection layer is formed in the same layer with an internal wiring layer electrically connected to a stub; wherein a first step for measuring the thickness of the multilayer printed wiring board and the depth of the reference depth detection layer in the reference depth detection region using a drill bit; a second step for moving the drill bit relative to the multilayer printed wiring board to a through-hole from which a stub needs to be removed (hereinafter referred to as "a backdrilling portion"); and a third step for performing a drilling process using the drill bit to a depth with respect to the multilayer printed wiring board at the backdrilling portion, the depth is calculated using the ratio of the depth of the reference depth detection layer to the thickness of the multilayer printed wiring board in the reference depth detection region.

The backdrilling method of claim 2 is featured in that, in the backdrilling method of claim 1, a plurality of the reference depth detection regions may be allocated at a plurality of locations, and the third step may include calculating a machining depth based on numerical value data obtained in the reference depth detection region closest to the backdrilling portion.

The backdrilling method of claim 3 is featured in that, in the backdrilling method of claim 1, the reference depth detection region may be allocated in an outer margin of the multilayer printed wiring board.

The backdrilling method of claim 4 is featured in that, in the backdrilling method of claim 1, the drill bit may be electrically conductive, and the first and third steps may include detecting an upper surface position of the multilayer printed wiring board when the drill bit is brought into contact with a conductive sheet affixed onto the multilayer printed wiring board.

A backdrilling apparatus of claim 5 for removing a stub present in a through-hole formed in a multilayer printed wiring board mounted on a table by drilling using a drill bit includes: using a multilayer printed wiring board in which a reference depth detection region is allocated where a reference depth detection layer is formed in the same level with an internal wiring layer electrically connected to a stub; a first control unit for measuring the thickness of the multilayer printed wiring board and the depth of the reference depth detection layer in the reference depth detection region using a drill bit; a second control unit for moving the drill bit relative to the multilayer printed wiring board to a backdrilling portion; and a third control unit for performing a drilling process using the drill bit to a depth with respect to the thickness of the multilayer printed wiring board at the backdrilling portion, the depth is calculated using the ratio of the depth of the reference depth detection layer to the thickness of the multilayer printed wiring board in the reference depth detection region.

The backdrilling apparatus of claim 6 is featured in that, in the backdrilling apparatus of claim 5, a plurality of the reference depth detection regions may be allocated at a plurality of locations, and the third control unit may be characterized by calculating said backdrilling depth based on numerical value data obtained in the reference depth detection region closest to the backdrilling portion.

According to yet another embodiment, the reference depth detection region may be allocated in an outer margin of the multilayer printed wiring board.

The backdrilling apparatus of claim 8 is featured in that, in the backdrilling apparatus of claim 5, the drill bit may be electrically conductive, and the first and third control units may be characterized by detecting an upper surface position of the multilayer printed wiring board when the drill bit is brought into contact with a conductive sheet affixed onto the multilayer printed wiring board.

According to the present invention, the backdrilling depth accuracy can be ensured even when the reference depth detection region is allocated apart from the circuit formation region in a multilayer printed wiring board having variations in thickness of its layers or its board thickness.

Further features of the present invention will become apparent from the following description of exemplary embodiments with reference to the attached drawings.

DESCRIPTION OF THE EMBODIMENTS

Hereinafter, embodiments of the present invention will be described with reference to the drawings.

First Embodiment

Figure 2:
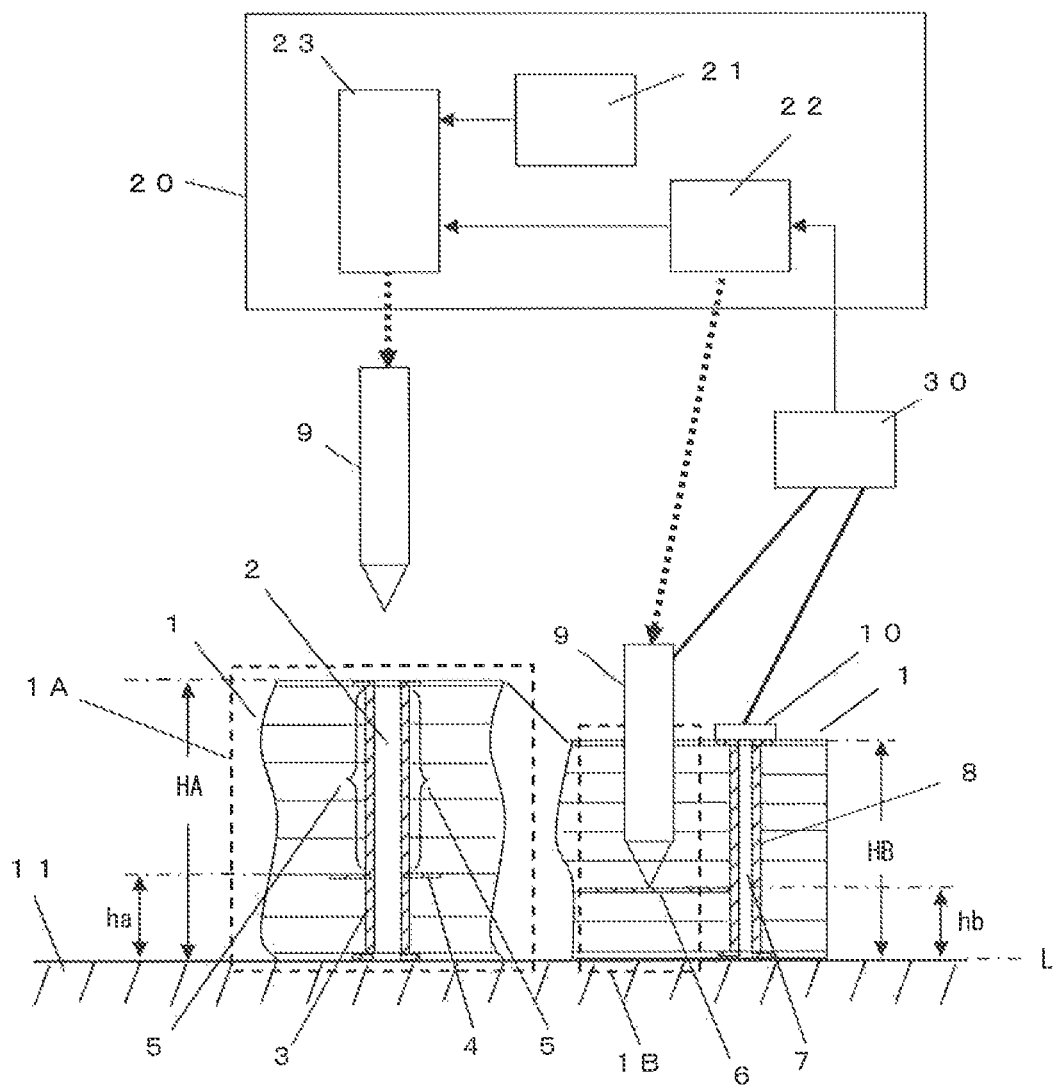
FIG. 2 is a schematic diagram for describing the operation of the first embodiment of the present invention.

FIG. 2 is a schematic diagram for describing the operation of a first embodiment of the present invention. In FIG. 2, the reference numeral 1 denotes a multilayer printed wiring board, the reference numeral 11 denotes a table on which the multilayer printed wiring board 1 is mounted, the reference numeral 2 denotes a through-hole from which a stub needs to be removed (backdrilling portion), provided in a circuit formation region 1A for circuit formation, the reference numeral 3 denotes a plated layer on the wall of the through-hole 2, the reference numeral 4 denotes an internal wiring layer electrically connected to the plated layer 3, and the reference numeral 5 denotes a stub to be backdrilled. The reference numeral 6 denotes a reference depth detection layer formed in a reference depth detection region 1B which is not allocated in the area for circuit formation. The reference depth detection layer 6 is positioned in the same layer with the internal wiring layer 4. In ordinal conditions, a plurality of reference depth detection regions 1B are allocated in the outer margin of the multilayer printed wiring board 1. The reference numeral 7 denotes a through-hole for detecting the reference depth that is formed near the reference depth detection region 1B and electrically connected to the reference depth detection layer 6 via a plated layer 8 formed in the through-hole 7. The reference numeral 9 denotes a drill bit, by using which the multilayer printed wiring board 1 is drilled, and which is a conventional drill bit having electrical conductivity at least on its surface. The reference numeral 10 denotes a contact pad disposed for electrical connection on top of the reference depth detection through-hole 7. The reference numeral 30 denotes a conduction detection unit for detecting when the drill bit 9 reaches the reference depth detection layer 6 by applying a voltage between the contact pad 10 and the drill bit 9.

The reference numeral 20 denotes an overall control unit for controlling the apparatus as a whole. The overall control unit 20 includes a table height detection control unit 21 for detecting the height of an upper surface position of the table 11, a reference depth detection control unit 22 for detecting the reference depth, and a backdrilling control unit 23 for backdrilling The overall control unit 20 may include control units other than the table height detection control unit 21, the reference depth detection control unit 22, and the backdrilling control unit 23, and may be implemented by a program-controlled processing device.

Figure 3:
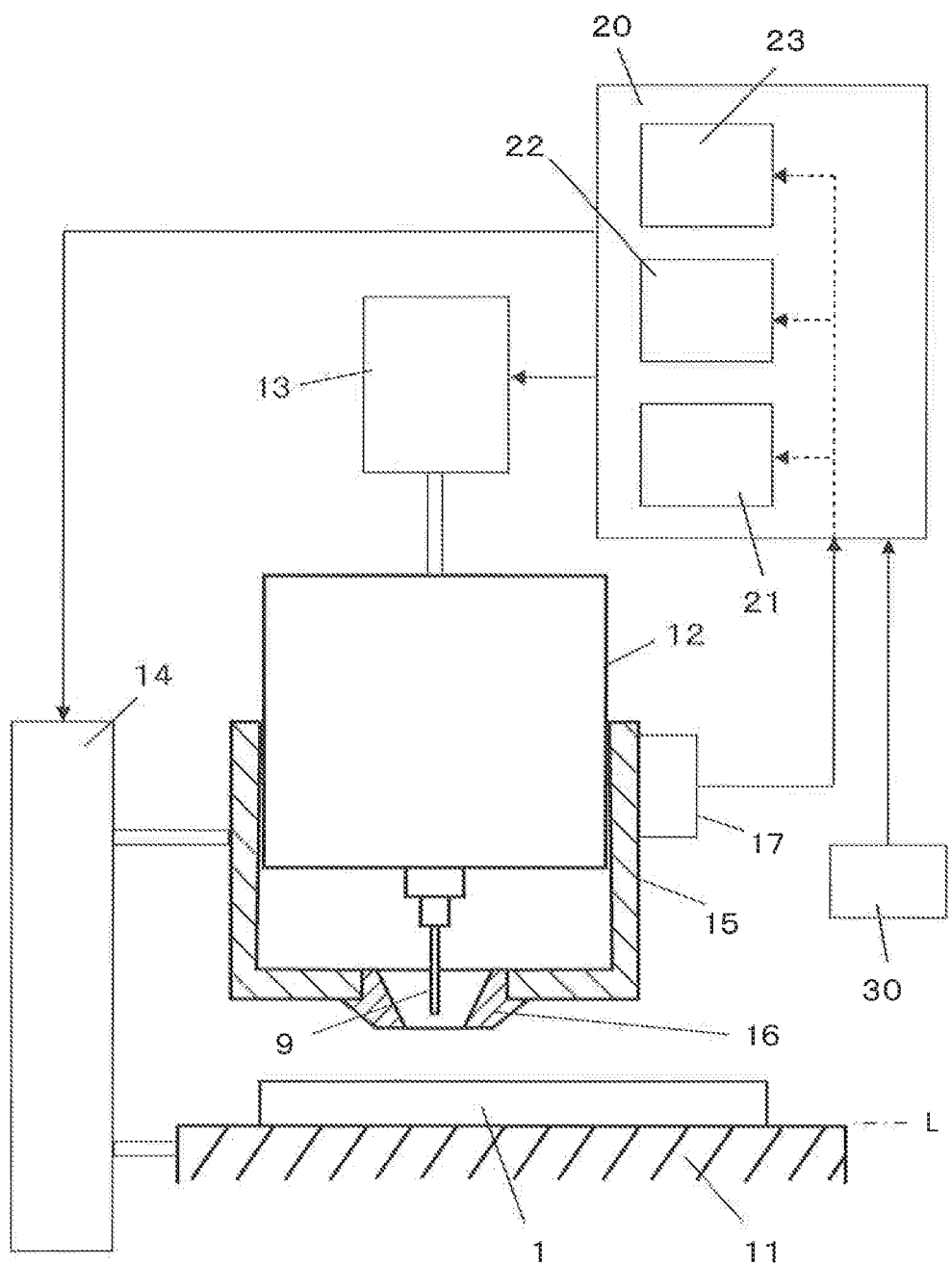
FIG. 3 is a diagram illustrating a constitution of a backdrilling apparatus according to the first embodiment of the present invention.
Figure 4:
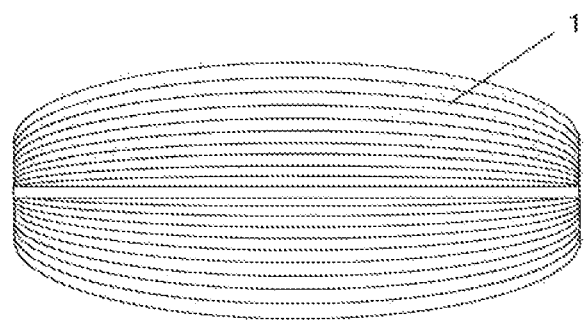
FIG. 4 is a cross-sectional view illustrating a multilayer printed wiring board.

FIG. 3 is a diagram illustrating a constitution of a backdrilling apparatus according to the first embodiment of the present invention. In FIG. 3, the same members or functions as those of FIG. 2 are designated with the same reference numerals. The reference numeral 12 denotes a spindle for rotating the drill bit 9, the reference numeral 13 denotes a vertical drive unit for moving the spindle 12 in the vertical direction, and the reference numeral 14 denotes a horizontal drive unit for relatively moving the table 11 and the spindle 12 in X and Y directions. While only one horizontal drive unit 14 is illustrated for simplifying the description, the horizontal drive units 14 are in fact provided for the X and Y direction movements, respectively. The vertical drive unit 13 and the horizontal drive units 14 are controlled by the table height detection control unit 21, the reference depth detection control unit 22, and the backdrilling control unit 23 of FIG. 1.

On the lower end portion of the spindle 12, a pressure foot 15 is fit closely, connected to an air cylinder unit which is not shown. The pressure foot 15 is constituted to move along with the spindle 12 until reaching a surface as the spindle 12 descends, and to move vertically independently of the spindle 12 the rest of the way. At the lower end of the pressure foot 15, a bushing 16 for pressing the upper surface of the multilayer printed wiring board 1 is held.

The reference numeral 17 denotes a position detector linked to the spindle 12. The position detector 17 descends with the spindle 12 until the pressure foot 15 reaches a surface. The position detector 17 outputs a detection signal upon detection of relative displacement between the spindle 12 and the pressure foot 15 in the vertical direction as the bushing 16 reaches the upper surface position of the table 11 or the multilayer printed wiring board 1 and only the pressure foot 15 cannot be lowered any further.

Figure 1:
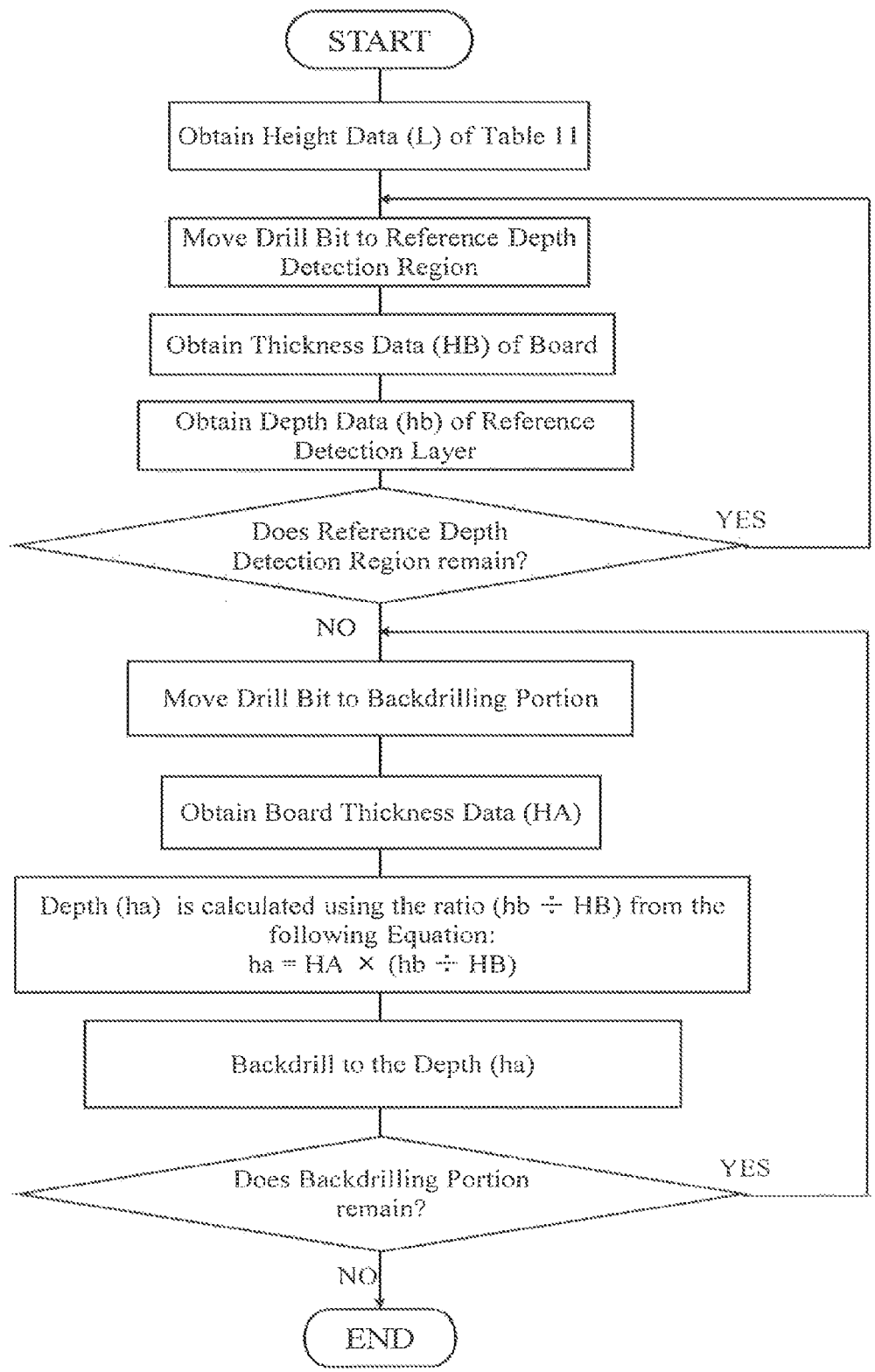
FIG. 1 is a flowchart for describing the operation of a first embodiment of the present invention.

The backdrilling apparatus illustrated in FIG. 3 is operated in the following way. FIG. 1 is a flowchart for describing the operation.

First, the table height detection control unit 21 executes the following control.

Here, the upper surface of the table 11 is logically divided into a matrix and that a plurality of lattice positions are recognized by the table height detection control unit 21. First, when the multilayer printed wiring board 1 is not placed on the table 11, the table 11 and the spindle 12 are relatively moved so that the drill bit 9 is positioned to face one lattice position on the table 11. Then, the spindle 12 and the pressure foot 15 are lowered together. As the bushing 16 reaches the upper surface position of the table 11, only the pressure foot 15 is stopped. At this time, the position detector 17 outputs a detection signal to the overall control unit 20. The feed position information from the vertical drive unit 13 at this time is stored in the table height detection control unit 21 as height data L of the upper surface position of the table 11.

The table height detection control unit 21 repeats the above operation for each of the plurality of lattice positions on the table 11, and stores the respective height data L.

Next, the reference depth detection control unit 22 executes the following control.

As the table 11 and the spindle 12 are relatively moved, the multilayer printed wiring board 1 and the drill bit 9 are relatively moved so as to position the drill bit 9 to face one reference depth detection region 1B. Then, the spindle 12 and the pressure foot 15 are both lowered. When the bushing 16 reaches the upper surface position of the multilayer printed wiring board 1, only the pressure foot 15 is stopped as in the above-described case. At this time, the position detector 17 outputs a detection signal to the overall control unit 20. The reference depth detection control unit 22, based on a difference between the feed position information from the vertical drive unit 13 at this time and the height data L of the table 11 previously stored, which is obtained using the height data of the lattice where the reference depth detection region 1B belongs, such as by averaging the heights at the surrounding lattice positions, determines the board thickness HB in the reference depth detection region 1B, and stores the thickness data in the reference depth detection control unit 22.

Even after the pressure foot 15 is stopped, the spindle 12 is further lowered and the drill bit 9 keeps drilling toward the reference depth detection layer 6. When the drill bit 9 reaches the reference depth detection layer 6, the conduction detection unit 30 outputs a detection signal to the reference depth detection control unit 22. Then, the reference depth detection control unit 22 obtains depth data hb of the reference depth detection layer 6 based on the amount of feed by the spindle 12 at this point at that time, and stores the data in the reference depth detection control unit 22.

The reference depth detection control unit 22 repeats the above-described operation for each of the plurality of reference depth detection regions 1B, and stores the respective board thickness data HB and depth data hb.

Next, the backdrilling control unit 23 executes the following control.

By relatively moving the table 11 and the spindle 12, the drill bit 9 is moved from the position in the reference depth detection region 1B, at which the depth of the reference depth detection layer 6 is determined, to a position (a backdrilling portion) in the circuit formation region 1A. The drill bit 9 is positioned to face the through-hole 2 for which backdrilling is required. Then, the spindle 12 and the pressure foot 15 are both lowered. When the bushing 16 is brought into contact with an external conductor layer 31 at the upper-most portion of the through-hole 2, the position detector 17 outputs a detection signal to the overall control unit 20. In response, the backdrilling control unit 23 calculates depth data ha for backdrilling in the following way.

The board thickness data HA of the backdrilling portion can be determined by reading from the table height detection control unit 21 the height data L of the table 11 measured in the lattice where the backdrilling portion belongs, and by the corresponding feed position information from the vertical drive unit 13. Thus, the board thickness data HB and the depth data hb obtained in the reference depth detection region 1B close to the backdrilling portion are read from the reference depth detection control unit 22 to determine depth data ha corresponding to the ratio of the depth data hb of the reference depth detection layer to the board thickness data HB of the reference depth detection region 1B (hb÷HB) with respect to the board thickness data HA of the backdrilling portion (HA×hb÷HB).

The backdrilling control unit 23 can recognize the current depth of the tip of the drill bit 9 based on the feed amount by the vertical drive unit 13. Thus, with reference to the height data L of the table 11 measured in the lattice where the backdrilling portion belongs, the backdrilling control unit 23 feeds the drill bit 9 vertically by the depth data ha with respect to the through-hole 2, thus performing backdrilling.

If all the backdrilling portions are machined, the backdrilling for this printed wiring board ends. If another printed wiring board is machined, the above-described steps should be repeated. However, because it is not necessary to perform the table height detection step frequently, the step can be omitted for the following boards. It is sufficient to perform the table height detection step every few days or every few months.

In the above-described example, the number of the reference depth detection layer 6 is one. However, in practice, there may be a plurality of internal wiring layers 4 connected to the through-hole 2 requiring backdrilling. Thus, a corresponding number of the reference depth detection layers 6 may be provided.

Accordingly, the reference depth detection control unit 22 may store the depth data hb of each reference depth detection layer 6. The backdrilling control unit 23 may then determine the depth data ha by reading from the reference depth detection control unit 22 the depth data hb corresponding to the internal wiring layer 4 connected to the stub 5 to be machined, and perform backdrilling.

The depth of an internal wiring layer 4 can be considered to vary similarly to its board thickness, even when the position of the internal wiring layer is varied as the board thickness of the multilayer printed wiring board 1 is varied.

According to the foregoing embodiment, the depth of the internal wiring layer 4 in the circuit formation region 1A is estimated by using the ratio of the depth of the reference depth detection layer 6 in the reference depth detection region 1B to the board thickness. Thus, the stub 5 can be removed from as close to the internal wiring layer 4 as possible.

In this embodiment, the multilayer printed wiring board 1 or the drilling mechanism, especially the drill bit, remains unchanged when the ratio is determined and when the ratio is used for backdrilling, and the respective operations are performed under the same environment. Thus, the accuracy of backdrilling is further increased.

In the foregoing embodiment, the height of the upper surface position is measured at a plurality of lattice positions on the table 11, and the height data L of the table 11 obtained from the lattice where the backdrilling portion belongs is used in backdrilling Accordingly, the influence of height variation of the table 11 is decreased, and thus the accuracy can be further increased.

Further, in the foregoing embodiment, a plurality of reference depth detection regions 1B is formed on the multilayer printed wiring board 1, and the depth of the internal wiring layer 4 in the circuit formation region 1A is estimated by using the measured data obtained from the reference depth detection region 1B closest to the backdrilling portion. Thus, the accuracy can be further increased.

In the foregoing embodiment, the backdrilling control unit 23 is for calculating the depth data ha by using the height data L of the table 11 stored in the table height detection control unit 21, the board thickness data HB in the reference depth detection region 1B stored in the reference depth detection control unit 22, and the depth data hb of the reference depth detection layer all at once at the time of backdrilling However, the following method may be alternatively used.

Specifically, the reference depth detection control unit 22 calculates and stores in advance the ratio of the depth data hb of the reference depth detection layer to the board thickness data HB in the reference depth detection region 1B (hb÷HB). Then, the backdrilling control unit 23 reads the ratio from the reference depth detection control unit 22 and multiplies the ratio by the board thickness data HA at the backdrilling portion so as to calculate the depth data ha (HA×hb÷HB).

In the foregoing embodiment, the reference depth detection region 1B is provided in the outer margin of the multilayer printed wiring board 1. Obviously, however, the present invention is applicable even when the reference depth detection region 1B is provided at other locations.

In the foregoing embodiment, the thicknesses of lands (contact pads) that may be formed on the upper-most surface or the lower-most surface of the multilayer printed wiring board 1 are ignored and assumed to be included in the thickness of the multilayer printed wiring board 1. However, when the thicknesses of the lands cannot be ignored compared to the thickness of the multilayer printed wiring board, the thicknesses should be subtracted from the thickness of the multilayer printed wiring board.

Second Embodiment

In the first embodiment, in order to detect the upper surface position of the multilayer printed wiring board 1 in the circuit formation region 1A or the reference depth detection region 1B, the output from the position detector 17 that mechanically detects when the spindle 12 and the pressure foot 15 are vertically displaced from each other is used. However, the accuracy may be further increased by electrical detection as follows.

Specifically, a thin conductive sheet is affixed onto the multilayer printed wiring board 1, and an axial voltage induced in the rotor shaft in the spindle 12 for rotating the drill bit 9 is detected via the conductive sheet when the drill bit 9 having conductivity is lowered and brought into contact with the conductive sheet, as disclosed in JP-A-2001-341052. Alternatively, as disclosed in JP-A-2012-101309, a change of the axial voltage may be detected on the spindle 12 side.

In the second embodiment, if the reference depth detection region 1B and the reference depth detection through-hole 7 are covered by the conductive sheet and connected to each other, the conduction detection unit 30 may detect conduction before the drill bit 9 reaches the reference depth detection layer 6 in detection. Thus, it is necessary to electrically separate the portion, by removing the conductive sheet around the portion corresponding to the reference depth detection through-hole 7, or by providing a slit around the portion, for example.

In the second embodiment, if the thickness of the electrically conductive sheet cannot be ignored compared to the thickness of the multilayer printed wiring board, the thickness should be subtracted from the thickness of the multilayer printed wiring board.

Other Embodiments

Embodiments of the present invention can also be realized by a computer of a system or apparatus that reads out and executes computer executable instructions recorded on a storage medium (e.g., non-transitory computer-readable storage medium) to perform the functions of one or more of the above-described embodiment(s) of the present invention, and by a method performed by the computer of the system or apparatus by, for example, reading out and executing the computer executable instructions from the storage medium to perform the functions of one or more of the above-described embodiment(s). The computer may comprise one or more of a central processing unit (CPU), micro processing unit (MPU), or other circuitry, and may include a network of separate computers or separate computer processors. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-032000, filed Feb. 21, 2014, Japanese Patent Application No. 2014-261418, filed Dec. 25, 2014, and Japanese Patent Application No. 2015-019220, filed on Feb. 3, 2015 which are hereby incorporated by reference herein in their entirety.

What is claimed is:

1. A backdrilling method for removing a stub present in a through-hole formed in a multilayer printed wiring board mounted on a table by drilling using a drill bit, said method comprising:
using a multilayer printed wiring board in which a reference depth detection region is allocated where a reference depth detection layer is formed in the same layer with an internal wiring layer electrically connected to a stub;
wherein a first step for measuring the thickness of said multilayer printed wiring board and the depth of said reference depth detection layer in said reference depth detection region using a drill bit;
a second step for moving said drill bit relative to said multilayer printed wiring board to a backdrilling portion; and
a third step for performing a drilling process using said drill bit to a depth with respect to the thickness of said multilayer printed wiring board at said backdrilling portion, said depth is calculated using the ratio of said depth of said reference depth detection layer to said thickness of said multilayer printed wiring board in said reference depth detection region.

2. The backdrilling method according to claim 1, wherein a plurality of said reference depth detection regions are allocated at a plurality of locations, and
said third step includes calculating said backdrilling depth based on numerical value data obtained in said reference depth detection region closest to said backdrilling portion.

3. The backdrilling method according to claim 1, wherein said reference depth detection region is allocated in an outer margin of said multilayer printed wiring board.

4. The backdrilling method according to claim 1, wherein said drill bit is electrically conductive, and
said first and third steps include detecting an upper surface position of said multilayer printed wiring board when said drill bit is brought into contact with a conductive sheet affixed onto said multilayer printed wiring board.

5. A backdrilling apparatus for removing a stub present in a through-hole formed in a multilayer printed wiring board mounted on a table by drilling using a drill bit, said apparatus comprising:
using a multilayer printed wiring board in which a reference depth detection region is allocated where a reference depth detection layer is formed in the same level with an internal wiring layer electrically connected to a stub;
a first control unit for measuring the thickness of said multilayer printed wiring board and the depth of said reference depth detection layer in said reference depth detection region using a drill bit;
a second control unit for moving said drill bit relative to said multilayer printed wiring board to a backdrilling portion; and
a third control unit for performing a drilling process using said drill bit to a depth with respect to the thickness of said multilayer printed wiring board at said backdrilling portion, said depth calculated using the ratio of said depth of said reference depth detection layer to said thickness of said multilayer printed wiring board in said reference depth detection region.

6. The backdrilling apparatus according to claim 5, wherein a plurality of said reference depth detection regions are allocated at a plurality of locations, and
said third control unit is characterized by calculating said backdrilling depth based on numerical value data obtained in said reference depth detection region closest to said backdrilling portion.

7. The backdrilling apparatus according to claim 6, wherein said drill bit is electrically conductive, and
said first and said third control units are characterized by detecting an upper surface position of said multilayer printed wiring board when said drill bit is brought into contact with a conductive sheet affixed onto said multilayer printed wiring board.

8. The backdrilling apparatus according to claim 5, wherein said reference depth detection region is allocated in an outer margin of said multilayer printed wiring board.

* * * * *